US012787801B2

(12) United States Patent
Koga et al.

(10) Patent No.: US 12,787,801 B2
(45) Date of Patent: Nov. 3, 2026

(54) METAL COMPONENT INCLUDING CONDUCTIVE SUBSTRATE WITH NICKEL LAYER AND NOBLE METAL LAYER

(71) Applicant: Mitsui High-tec, Inc., Fukuoka (JP)

(72) Inventors: Kento Koga, Fukuoka (JP); Shintaro Sugyo, Fukuoka (JP); Tomokatsu Kunitake, Fukuoka (JP)

(73) Assignee: Mitsui High-tec, Inc., Fukuoka (JP)

( * ) Notice: Subject to any disclaimer, the term of this patent is extended or adjusted under 35 U.S.C. 154(b) by 402 days.

(21) Appl. No.: 18/458,668

(22) Filed: Aug. 30, 2023

(65) Prior Publication Data

US 2024/0079298 A1 Mar. 7, 2024

(30) Foreign Application Priority Data

Sep. 2, 2022 (JP) ................................ 2022-139760

(51) Int. Cl.

| | |
|---|---|
| ***H10W 70/40*** | (2026.01) |
| ***C25D 5/12*** | (2006.01) |
| ***H10W 72/00*** | (2026.01) |
| ***H10W 72/50*** | (2026.01) |
| ***H10W 90/00*** | (2026.01) |

(52) U.S. Cl.

CPC ............ *H10W 70/457* (2026.01); *C25D 5/12* (2013.01); *H10W 72/5522* (2026.01); *H10W 72/5525* (2026.01); *H10W 72/884* (2026.01); *H10W 90/736* (2026.01); *H10W 90/756* (2026.01)

(58) Field of Classification Search

CPC ... H01L 23/49582; H01L 24/32; H01L 24/45; H01L 24/48; H01L 24/73; H01L 2224/32245; H01L 2224/45144; H01L 2224/45147; H01L 2224/48247; H01L 2224/73265; H01L 2924/014; C25D 5/12; C25D 5/14; C23C 18/165; H10W 70/457; H10W 72/884; H10W 90/736; H10W 90/756; H10W 72/5522; H10W 72/5525

See application file for complete search history.

(56) References Cited

U.S. PATENT DOCUMENTS

| | | | | |
|---|---|---|---|---|
| 2002/0003292 A1* | 1/2002 | Abbott | H10W 74/129 | 257/E23.047 |
| 2008/0087996 A1* | 4/2008 | Miyaki | H10W 74/111 | 257/E23.037 |
| 2009/0039486 A1 | 2/2009 | Shimazaki et al. | | |
| 2014/0291827 A1 | 10/2014 | Sato et al. | | |
| 2019/0131218 A1* | 5/2019 | Li | H01L 21/4821 | |
| 2024/0063096 A1* | 2/2024 | Tanaka | H10W 70/411 | |

FOREIGN PATENT DOCUMENTS

| | | |
|---|---|---|
| JP | S5936954 A | 2/1984 |
| JP | 4-115558 A | 4/1992 |
| JP | 2006310397 A | 11/2006 |
| JP | 2014086686 A | 5/2014 |
| JP | 2014192222 A | 10/2014 |

* cited by examiner

*Primary Examiner* — John P. Dulka

(74) *Attorney, Agent, or Firm* — RANKIN, HILL & CLARK LLP

(57) ABSTRACT

Provided is a metal component used for manufacturing a semiconductor device, the metal component including: a substrate having a conductivity; a nickel layer formed on a portion of a surface of the substrate and containing nickel as a main component; and a noble metal layer formed on a surface of the nickel layer.

16 Claims, 2 Drawing Sheets

METAL COMPONENT INCLUDING CONDUCTIVE SUBSTRATE WITH NICKEL LAYER AND NOBLE METAL LAYER

CROSS-REFERENCE TO RELATED APPLICATION

This application is based on Japanese Patent Application No. 2022-139760 filed with the Japan Patent Office on Sep. 2, 2022, the entire content of which is hereby incorporated by reference.

BACKGROUND

1. Technical Field

A disclosed embodiment relates to a metal component.

2. Related Art

Conventionally, there has been known a technique for forming a nickel plating layer on a surface of a metal substrate of a metal component such as a lead frame used for manufacturing a semiconductor device. Further, as an example thereof, a technique called pre-plated lead frame (Pd-PPF) is known (see JP-A-04-115558). In this technique, the nickel plating layer, a palladium plating layer, and a gold plating layer are formed in this order on the surface of the metal substrate of the lead frame.

However, nickel constituting the nickel plating layer is a magnetic material. Therefore, when the semiconductor device is operated at a high frequency, conductor loss of the semiconductor device increases in the nickel plating layer.

One aspect of the embodiment has been made in view of the above. An object of the one aspect of the embodiment is to provide a metal component used for manufacturing a semiconductor device that can be operated efficiently at a high frequency.

SUMMARY

A metal component used for manufacturing a semiconductor device includes: a substrate having a conductivity; a nickel layer formed on a portion of a surface of the substrate and containing nickel as a main component; and a noble metal layer formed on a surface of the nickel layer.

DETAILED DESCRIPTION

Figure 1A:
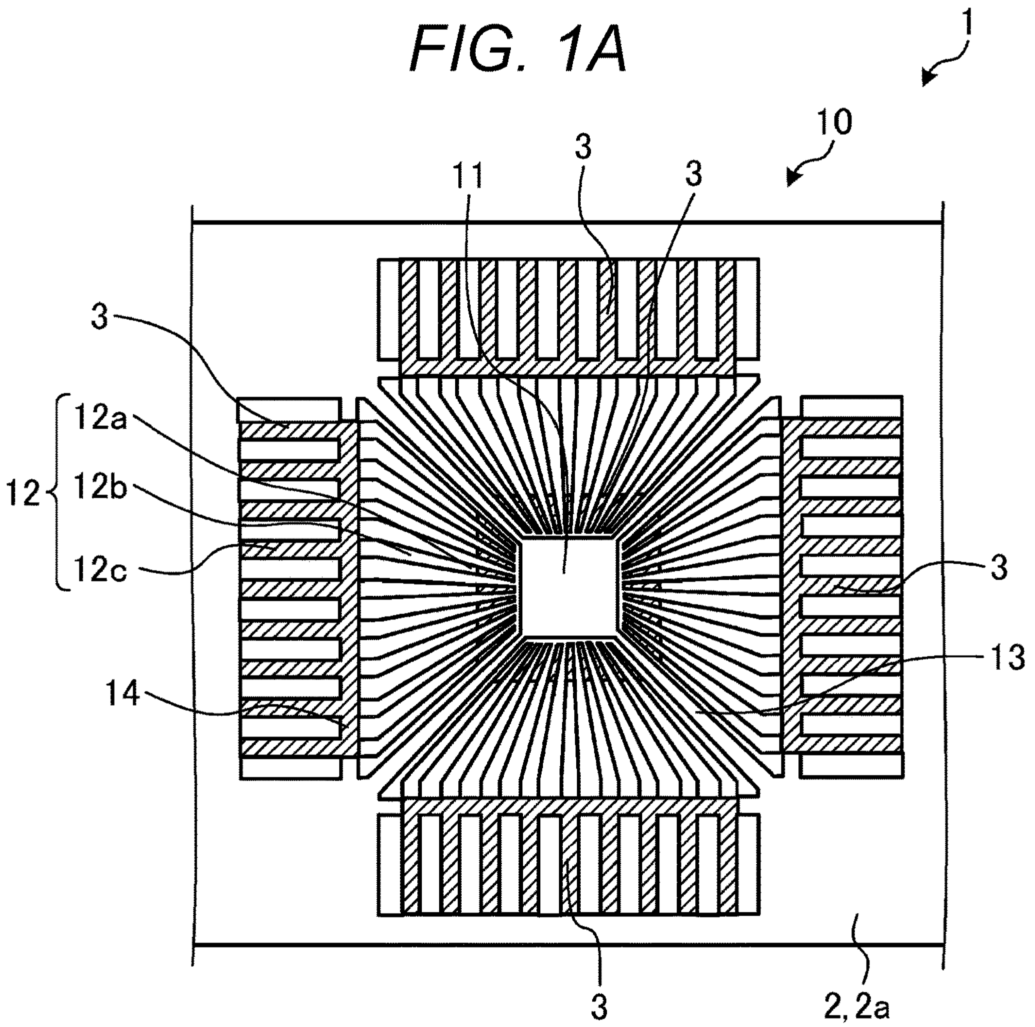
FIG. 1A is a schematic diagram of a lead frame according to an embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A metal component used for manufacturing a semiconductor device, according to one aspect of an embodiment, includes a substrate, a nickel layer, and a noble metal layer. The substrate has a conductivity. The nickel layer is formed on a portion of a surface of the substrate and contains nickel as a main component. The noble metal layer is formed on a surface of the nickel layer.

According to the one aspect of the embodiment, the semiconductor device can be operated efficiently at a high frequency.

A lead frame will be described below as an example of the metal component used for manufacturing the semiconductor device, disclosed in the present application with reference to the accompanying drawings. Note that embodiments described below do not limit a technique of the present disclosure.

Further, the drawings are schematic. It should be noted that dimensional relationships between elements, ratios of the elements, and the like described in the drawings may differ from reality. Furthermore, also between the drawings, the dimensional relationships between the elements and the ratios of the elements illustrated in the drawings may differ from one drawing to another.

Figure 1B:
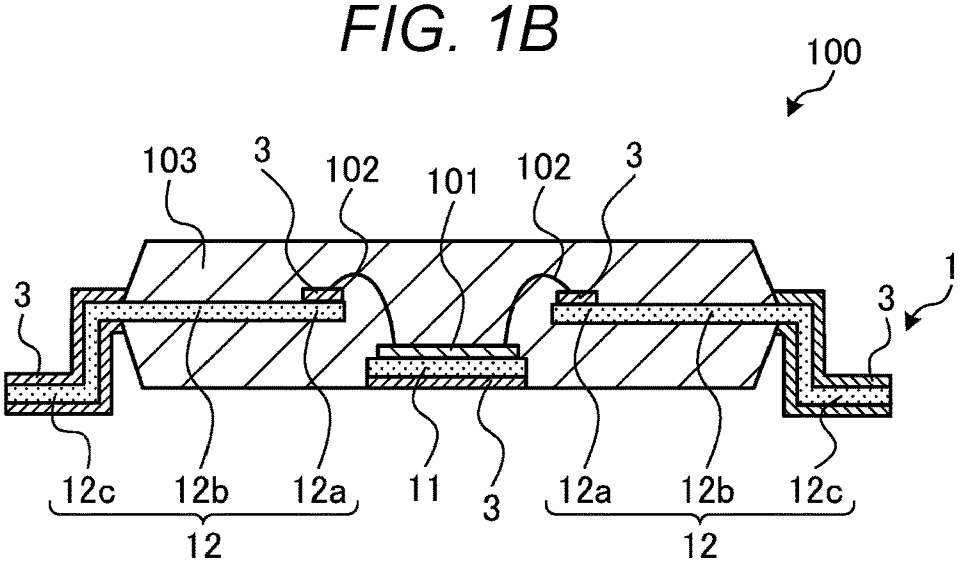
FIG. 1B is a cross-sectional view illustrating a semiconductor device according to the embodiment.

FIG. 1A is a schematic diagram of a lead frame 1 according to an embodiment. FIG. 1B is a cross-sectional view illustrating a semiconductor device 100 according to the embodiment.

The lead frame 1 illustrated in FIG. 1A is a lead frame used for manufacturing a quad flat package (QFP) type semiconductor device 100. Note that the technique of the present disclosure may be applied to a lead frame used for manufacturing other types of semiconductor devices such as small outline package (SOP), or quad flat non-lead package (QFN) having a lead exposed on a back surface of the semiconductor device.

The lead frame 1 according to the embodiment has, for example, a strip shape in plan view. For example, a plurality of unit lead frames 10 are formed side by side in a longitudinal direction of the lead frame 1. Such a unit lead frame 10 is a portion corresponding to each semiconductor device 100 manufactured using the lead frame 1. Note that the plurality of unit lead frames 10 may be formed side by side not only in the longitudinal direction but also in a width direction of the lead frame 1.

As illustrated in FIG. 1A, the unit lead frame 10 has a die pad 11, a plurality of leads 12, a die pad support portion 13, and a dam bar 14. Note that although not shown in FIG. 1A, pilot holes may be provided side by side on a side surface on a long side of the lead frame 1.

The die pad 11 is provided, for example, in a central portion of the unit lead frame 10. A semiconductor element 101 can be mounted on a front surface side of the die pad 11 as illustrated in FIG. 1B.

The die pad 11 is connected to an outer edge portion of the unit lead frame 10 by the die pad support portion 13 and supported by the unit lead frame 10. Such a die pad support portion 13 is provided, for example, at each of four corners of the die pad 11.

The plurality of leads 12 are arranged side by side around the die pad 11. A tip portion 12*a* of each lead 12 extends from the outer edge portion of the unit lead frame 10 toward the die pad 11. As illustrated in FIG. 1B, such a lead 12 functions as a connection terminal of the semiconductor device 100.

The lead 12 has a tip portion 12*a*, an intermediate portion 12*b*, and a base end portion 12*c*. As illustrated in FIG. 1B, in the semiconductor device 100, a bonding wire 102 including Cu, a Cu alloy, Au, an Au alloy, or the like is connected to the tip portion 12*a* of the lead 12. Therefore, the lead frame 1 is required to have high bonding characteristics with the bonding wire 102. The dam bar 14 connects adjacent leads 12 to each other.

The semiconductor device 100 has a sealing resin 103 in addition to the lead frame 1, the semiconductor element 101, and the bonding wire 102. The sealing resin 103 is configured to contain, for example, an epoxy resin or the like. The sealing resin 103 is molded into a predetermined shape by a molding process or the like. The sealing resin 103 seals the semiconductor element 101, the bonding wire 102, the die pad 11, and the like.

Further, the base end portion 12*c* of the lead 12 functions as an external terminal (outer lead) of the semiconductor device 100 and is solder-bonded to a board. Further, in the semiconductor device 100 of the type having a back surface of the die pad 11 exposed from the sealing resin 103 and in the semiconductor device 100 of the type having the heat slug provided, the back surface of the semiconductor device 100 is solder-bonded to the board. Therefore, the lead frame 1 is required to have high wettability to solder.

Note that the dam bar 14 has a function as a dam for decreasing leakage of the resin used to the base end portion 12*c* (outer lead) side in the molding process of molding the sealing resin 103. The dam bar 14 is finally cut in a manufacturing process of the semiconductor device 100. The intermediate portion 12*b* of the lead 12 connects the tip portion 12*a* and the base end portion 12*c*.

Figure 2A:
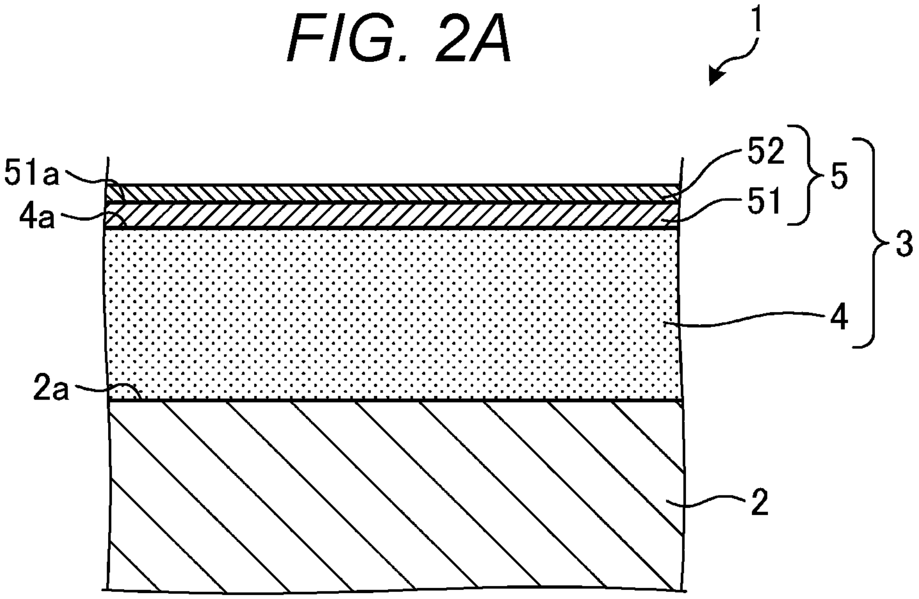
FIG. 2A is an enlarged cross-sectional view of the lead frame according to the embodiment.

FIG. 2A is an enlarged cross-sectional view of the lead frame 1 according to the embodiment. As illustrated in FIG. 2A, the lead frame 1 according to the embodiment includes a conductive substrate 2 and a metal layer 3. The substrate 2 is configured to include a material (for example, a metal material such as copper or copper alloy) having a conductivity.

The metal layer 3 has a nickel layer 4 and a noble metal layer 5. The nickel layer 4 is formed on a portion of a surface 2*a* of the substrate 2. The nickel layer 4 contains nickel (Ni) as a main component. The nickel layer 4 can be formed, for example, by nickel plating.

The noble metal layer 5 is formed on a surface 4*a* of the nickel layer 4. The noble metal layer 5 contains at least one of palladium (Pd), platinum (Pt), gold (Au), and silver (Ag) as a main component. Note that the noble metal layer 5 may be a single layer, or may be a plurality of layers.

For example, in an example of FIG. 2A, noble metal layer 5 includes a palladium layer 51 and a gold layer 52. The palladium layer 51 is formed on the surface 4*a* of the nickel layer 4. The gold layer 52 is formed on a surface 51*a* of the palladium layer 51.

The palladium layer 51 contains palladium as a main component. The palladium layer 51 can be formed, for example, by palladium plating. The gold layer 52 contains gold as a main component. The gold layer 52 can be formed, for example, by gold plating.

The noble metal layer 5 is configured to contain a noble metal that is difficult to oxidize. Thus, in the lead frame 1 according to the embodiment, formation of oxide on a surface of the metal layer 3 can be restrained. Therefore, according to the embodiment, it is possible to form the lead frame 1 in which wettability of the solder and the bonding characteristics of the bonding wire 102 (see FIG. 1B) are compatible.

Note that the noble metal layer 5 according to the embodiment is not limited to being configured to include the palladium layer 51 and the gold layer 52, and may be configured to further include a silver layer containing silver as a main component. Further, the noble metal layer 5 according to the embodiment may be configured to have only the silver layer.

Here, in an embodiment, as illustrated in FIGS. 1A and 1B, the metal layer 3 including the nickel layer 4 (see FIG. 2A) is formed on only a portion of a surface of the lead frame 1 rather than on the entire surface of the lead frame 1.

For example, as illustrated in FIG. 1B, in the lead frame 1, the metal layer 3 is formed on front and back surfaces of the substrate 2 (see FIG. 2A) at the base end portion 12*c*, the front surface of the substrate 2 at the tip portion 12*a*, and the back surface of the substrate 2 at the die pad 11.

Thus, a volume of the nickel layer 4 provided in the lead frame 1 is reduced compared to a case where the metal layer 3 is formed on the entire surface of the lead frame 1. That is, in the embodiment, a volume of nickel, which is a magnetic material, in the lead frame 1 can be reduced. Therefore, conductor loss of the semiconductor device 100 caused by such nickel is reduced.

Therefore, according to the embodiment, the semiconductor device 100 can operate efficiently at a high frequency.

Note that in the present disclosure, a location in which the metal layer 3 is disposed in the lead frame 1 is not limited to a location illustrated in FIG. 1B. For example, the metal layer 3 may also be disposed on the front surface of the substrate 2 in the die pad 11. Thus, the semiconductor element 101 can be solder-bonded to a front surface of the die pad 11.

Further, in the embodiment, the nickel layer 4 may contain phosphorus (P) in a predetermined ratio (for example, 0.01 wt % to 1 wt %). This makes it difficult for the copper contained in the substrate 2 to diffuse within the nickel layer 4. A reason for this is presumed to be that within the nickel layer 4, phosphorus concentrated at an interface between adjacent crystal grains inhibits diffusion of the copper.

Therefore, according to the embodiment, a thickness of the nickel layer 4 can be reduced. Thus, the volume of nickel, which is the magnetic material, can be further reduced. Therefore, according to the embodiment, the semiconductor device 100 can operate more efficiently at a high frequency.

Note that the present disclosure is not limited to a case where the nickel layer 4 contains phosphorus, and the nickel layer 4 may not contain phosphorus.

Figure 2B:
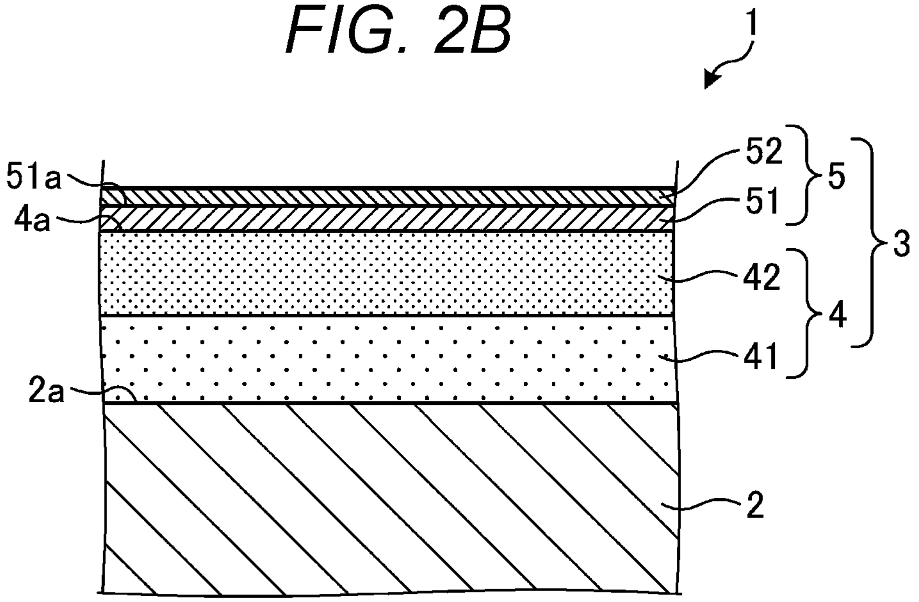
FIG. 2B is an enlarged cross-sectional view of the lead frame according to a modification of the embodiment.

FIG. 2B is an enlarged cross-sectional view of the lead frame 1 according to a modification of the embodiment. As illustrated in FIG. 2B, the nickel layer 4 may have a two-layer structure. The nickel layer 4 according to this modification includes a first nickel layer 41 and a second nickel layer 42.

The first nickel layer 41 is a nickel layer containing no phosphorus. Note that in the present disclosure, "containing no phosphorus" includes a case where phosphorus, which is an unavoidable impurity, is contained. The second nickel layer 42 is a nickel layer containing phosphorus in the predetermined ratio (for example, 0.01 wt % to 1 wt %).

Even with such a configuration, the phosphorus contained in the second nickel layer 42 makes it difficult for the copper contained in the substrate 2 to diffuse within the nickel layer 4. Thus, the thickness of the nickel layer 4 as a whole can be reduced, so that the volume of nickel, which is the magnetic material, can be further reduced.

Therefore, according to the modification, the semiconductor device 100 can operate more efficiently at a high frequency.

In an example of FIG. 2B, the first nickel layer 41 containing no phosphorus is located on the substrate 2 side, and the second nickel layer 42 containing phosphorus is located on the noble metal layer 5 side. However, the present disclosure is not limited to such an example. For example, the second nickel layer 42 containing phosphorus may be located on the substrate 2 side, and the first nickel layer 41 containing no phosphorus may be located on the noble metal layer 5 side.

Further, in the embodiment, the conductor loss ac (dB) of the nickel layer 4 in the semiconductor device 100 may satisfy the following formula (1).

$$\alpha c \leq (6.0 \cdot 10^{-12} \cdot K_3 \cdot f^{1/2})/W \quad (1)$$

Here, $K_3$ is a constant determined by a shape of the nickel layer 4, and when expressed using a characteristic impedance $Z_0$, $K_3=\pi^{1/2}/2Z_0$. Further, f is an operating frequency (Hz) of the semiconductor device 100. W is a width (m) of the nickel layer 4.

Thus, by setting the conductor loss of the nickel layer 4 in the semiconductor device 100 to be equal to or less than a value defined by the formula (1), the semiconductor device 100 can operate efficiently at a high frequency f.

Further, in the embodiment, the conductor loss αc (dB) of the nickel layer 4 in the semiconductor device 100 may satisfy the following formula (2).

$$\alpha c \leq (3.7 \cdot 10^{-12} \cdot K_3 \cdot f^{1/2})/W \quad (2)$$

Thus, by setting the conductor loss of the nickel layer 4 in the semiconductor device 100 to be equal to or less than a value defined by the formula (2), the semiconductor device 100 can operate efficiently at the high frequency f.

Further, in the embodiment, the conductor loss αc (dB) of the nickel layer 4 in the semiconductor device 100 may satisfy the following formula (3).

$$\alpha c \leq (1.5 \cdot 10^{-12} \cdot K_3 \cdot f^{1/2})/W \quad (3)$$

Thus, by setting the conductor loss of the nickel layer 4 in the semiconductor device 100 to be equal to or less than a value defined by the formula (3), the semiconductor device 100 can operate efficiently at the high frequency f.

Further, in the embodiment, the conductor loss αc (dB) of the nickel layer 4 in the semiconductor device 100 may satisfy the following formula (4).

$$\alpha c \geq (3.8 \cdot 10^{-13} \cdot K_3 \cdot f^{1/2})/W \quad (4)$$

Thus, by setting the conductor loss of the nickel layer 4 in the semiconductor device 100 to be equal to or greater than a value defined by the formula (4), it is possible to restrain the nickel layer 4 from becoming too thin. This makes it difficult for the copper contained in the substrate 2 to diffuse within the nickel layer 4.

Therefore, according to the embodiment, reliability of the semiconductor device 100 is improved.

Further, in the embodiment, the conductor loss αc (dB) of the nickel layer 4 in the semiconductor device 100 may satisfy the following formula (5).

$$\alpha c \geq (7.6 \cdot 10^{-13} \cdot K_3 \cdot f^{1/2})/W \quad (5)$$

Thus, by setting the conductor loss of the nickel layer 4 in the semiconductor device 100 to be equal to or greater than a value defined by the formula (5), it is possible to restrain the nickel layer 4 from becoming too thin. This makes it difficult for the copper contained in the substrate 2 to diffuse within the nickel layer 4.

Therefore, according to the embodiment, the reliability of the semiconductor device 100 is improved.

Further, in the embodiment, the surface 2*a* of the substrate 2 on which the nickel layer 4 is not formed may be a rough surface among surfaces 2*a* of the substrate 2. Such a rough surface is provided, for example, by oxidizing the surface 2*a* of the substrate 2 containing copper to form acicular oxide.

This can improve adhesion between the lead frame 1 and the sealing resin 103 (see FIG. 1B), thereby improving the reliability of the semiconductor device 100.

Note that in the present disclosure, the rough surface of the base material 2 is not limited to a case of including acicular oxide. The rough surface of the substrate 2 may be a rough surface formed by other methods. Further, in the present disclosure, the surface 2*a* of the substrate 2 on which the nickel layer 4 is not formed need not be a rough surface.

The embodiments of the present disclosure have been described above. However, the technique of the present disclosure is not limited to the above-described embodiments. Various modifications can be made without departing from the gist of the present disclosure. For example, another metal layer may be provided between the substrate of the lead frame and the nickel layer.

Further advantageous effects and modifications can be easily derived by those skilled in the art. Therefore, the broader aspects of the technique of the present disclosure are not limited to the specific details and representative embodiments presented and described above. Accordingly, various changes can be made without departing from the spirit or scope of the general technical concept defined by the appended claims and equivalents thereof.

The present technique can employ the following configurations:

[1]

A metal component used for manufacturing a semiconductor device, the metal component including: a substrate having a conductivity; a nickel layer formed on a portion of a surface of the substrate and containing nickel as a main component; and a noble metal layer formed on a surface of the nickel layer.

[2]

The metal component according to [1], in which conductor loss αc (dB) of the nickel layer in the semiconductor device satisfies following formula (1):

$$\alpha c \leq (6.0 \cdot 10^{-12} \cdot K_3 \cdot f^{1/2})/W \quad (1)$$

where;

$K_3$: constant determined by a shape of the nickel layer;

f: operating frequency of the semiconductor device (Hz); and

W: width of the nickel layer (m).

[3]

The metal component according to [1], in which conductor loss αc (dB) of the nickel layer in the semiconductor device satisfies following formula (2):

$$\alpha c \leq (3.7 \cdot 10^{-12} \cdot K_3 \cdot f^{1/2})/W \quad (2)$$

where;

$K_3$: constant determined by a shape of the nickel layer;

f: operating frequency of the semiconductor device (Hz); and

W: width of the nickel layer (m).

[4]

The metal component according to [1], in which conductor loss αc (dB) of the nickel layer in the semiconductor device satisfies following formula (3):

$$\alpha c \leq (1.5 \cdot 10^{-12} \cdot K_3 \cdot f^{1/2})/W \quad (3)$$

where;

$K_3$: constant determined by a shape of the nickel layer;

f: operating frequency of the semiconductor device (Hz); and

W: width of the nickel layer (m).

[5]

The metal component according to any one of [1] to [4], in which the nickel layer contains phosphorus.

[6]

The metal component according to any one of [1] to [4], in which the nickel layer includes a first nickel layer containing no phosphorus and a second nickel layer containing phosphorus.

[7]

The metal component according to any one of [1] to [4], in which the noble metal layer contains at least one of palladium, platinum, gold, and silver as a main component.

[8]

The metal component according to any one of [1] to [4], in which a surface of the substrate on which the nickel layer is not formed is a rough surface among surfaces of the substrate.

What is claimed is:

1. A metal component in the form of a lead frame used for manufacturing a semiconductor device, the metal component comprising a die pad and a plurality of leads, each one of the leads comprising a tip portion to be bonded to a bonding wire, an intermediate portion and a base end portion, the base end portion to be solder-bonded to a board, the metal component comprising:

a substrate having an electrical conductivity;

a nickel layer formed on a portion of a surface of the substrate and containing nickel as a main component; and a noble metal layer formed on a surface of the nickel layer, wherein the nickel layer is formed only on a front surface of the substrate at the tip portion of the leads, front and back surfaces of the substrate at the base end portion of the leads, and the back surface of the substrate at the die pad, and optionally a front surface of the die pad, and conductor loss αc (dB) of the nickel layer in the semiconductor device satisfies following formula (1):

$$\alpha c \leq (6.0 \cdot 10^{-12} \cdot K_3 \cdot f^{1/2})/W \quad (1)$$

where;

$K_3$: constant determined by a shape of the nickel layer, $K_3 = \pi^{1/2}/2Z_0$, where $Z_0$: characteristic impedance;

f: operating frequency of the semiconductor device (Hz); and

W: width of the nickel layer (m).

2. The metal component according to claim 1, wherein the nickel layer contains phosphorus.

3. The metal component according to claim 1, wherein the nickel layer includes a first nickel layer containing no phosphorus and a second nickel layer containing phosphorus.

4. The metal component according to claim 1, wherein the noble metal layer contains at least one of palladium, platinum, gold, and silver as a main component.

5. A metal component in the form of a lead frame used for manufacturing a semiconductor device, the metal component comprising a die pad and a plurality of leads, each one of the leads comprising a tip portion to be bonded to a bonding wire, an intermediate portion and a base end portion, the base end portion to be solder-bonded to a board, the metal component comprising:

a substrate having an electrical conductivity;

a nickel layer formed on a portion of a surface of the substrate and containing nickel as a main component; and a noble metal layer formed on a surface of the nickel layer, wherein the nickel layer is formed only on a front surface of the substrate at the tip portion of the leads, front and back surfaces of the substrate at the base end portion of the leads, and the back surface of the substrate at the die pad, and optionally a front surface of the die pad, and conductor loss αc (dB) of the nickel layer in the semiconductor device satisfies following formula (2):

$$\alpha c \leq (3.7 \cdot 10^{-12} \cdot K_3 \cdot f^{1/2})/W \quad (2)$$

where;

$K_3$: constant determined by a shape of the nickel layer, $K_3 = \pi^{1/2}/2Z_0$, where $Z_0$: characteristic impedance;

f: operating frequency of the semiconductor device (Hz); and

W: width of the nickel layer (m).

6. The metal component according to claim 5, wherein the nickel layer contains phosphorus.

7. The metal component according to claim 5, wherein the nickel layer includes a first nickel layer containing no phosphorus and a second nickel layer containing phosphorus.

8. The metal component according to claim 5, wherein the noble metal layer contains at least one of palladium, platinum, gold, and silver as a main component.

9. A metal component in the form of a lead frame used for manufacturing a semiconductor device, the metal component comprising a die pad and a plurality of leads, each one of the leads comprising a tip portion to be bonded to a bonding wire, an intermediate portion and a base end portion, the base end portion to be solder-bonded to a board, the metal component comprising:

a substrate having an electrical conductivity;

a nickel layer formed on a portion of a surface of the substrate and containing nickel as a main component; and a noble metal layer formed on a surface of the nickel layer, wherein the nickel layer is formed only on a front surface of the substrate at the tip portion of the leads, front and back surfaces of the substrate at the base end portion of the leads, and the back surface of the substrate at the die pad, and optionally a front surface of the die pad, and conductor loss αc (dB) of the nickel layer in the semiconductor device satisfies following formula (3):

$$\alpha c \leq (1.5 \cdot 10^{-12} \cdot K_3 \cdot f^{1/2})/W \quad (3)$$

where;

$K_3$: constant determined by a shape of the nickel layer, $K_3 = \pi^{1/2}/2Z_0$, where $Z_0$: characteristic impedance;

f: operating frequency of the semiconductor device (Hz); and

W: width of the nickel layer (m).

10. The metal component according to claim 9, wherein the nickel layer contains phosphorus.

11. The metal component according to claim 9, wherein the nickel layer includes a first nickel layer containing no phosphorus and a second nickel layer containing phosphorus.

12. The metal component according to claim 9, wherein the noble metal layer contains at least one of palladium, platinum, gold, and silver as a main component.

13. A metal component in the form of a lead frame used for manufacturing a semiconductor device, the metal component comprising a die pad and a plurality of leads, each one of the leads comprising a tip portion to be bonded to a bonding wire, an intermediate portion and a base end portion, the base end portion to be solder-bonded to a board, the metal component comprising:

a substrate having an electrical conductivity;

a nickel layer formed on a portion of a surface of the substrate and containing nickel as a main component; and a noble metal layer formed on a surface of the nickel layer, wherein the nickel layer is formed only on a front surface of the substrate at the tip portion of the leads, front and back surfaces of the substrate at the base end portion of the leads, and the back surface of the substrate at the die pad, and optionally a front surface of the die pad, and another portion of the surface of the substrate on which the nickel layer is not formed includes an acicular oxide.

14. The metal component according to claim 13, wherein the nickel layer contains phosphorus.

15. The metal component according to claim 13, wherein the nickel layer includes a first nickel layer containing no phosphorus and a second nickel layer containing phosphorus.

16. The metal component according to claim 13, wherein the noble metal layer contains at least one of palladium, platinum, gold, and silver as a main component.

* * * * *